United States Patent
Tsao et al.

(10) Patent No.: US 7,843,058 B2
(45) Date of Patent: Nov. 30, 2010

(54) FLIP CHIP PACKAGES WITH SPACERS SEPARATING HEAT SINKS AND SUBSTRATES

(75) Inventors: Pei-Haw Tsao, Tai-Chung (TW); Liang-Chen Lin, Hsin-Chu (TW); Pao-Kang Niu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 274 days.

(21) Appl. No.: 11/928,971

(22) Filed: Oct. 30, 2007

(65) Prior Publication Data

US 2009/0108429 A1 Apr. 30, 2009

(51) Int. Cl.
*H01L 23/34* (2006.01)
(52) U.S. Cl. .............. 257/718; 257/706; 257/707; 257/711; 257/717; 257/E33.075; 257/E23.051; 257/E23.083; 257/E23.084; 361/709; 361/769; 361/770

(58) Field of Classification Search .............. 257/276, 257/625, 706, 707, 711–722, 796, E33.075, 257/E31.131, E23.051, E23.08–E23.113; 361/769, 770, 701–703, 709–714, 717–720; 174/548, 554

See application file for complete search history.

(56) References Cited

U.S. PATENT DOCUMENTS

| 5,841,194 | A | * | 11/1998 | Tsukamoto ................. 257/729 |
| 6,084,178 | A |   | 7/2000  | Cromwell |
| 6,909,176 | B1 | * | 6/2005 | Wang et al. ................. 257/706 |
| 2004/0036162 | A1 | | 2/2004 | Chuang et al. |
| 2006/0063310 | A1 | | 3/2006 | Jadhav et al. |
| 2008/0042263 | A1 | * | 2/2008 | Wang et al. ................. 257/712 |

* cited by examiner

*Primary Examiner*—Jasmine J Clark
(74) *Attorney, Agent, or Firm*—Slater & Matsil, L.L.P.

(57) ABSTRACT

A package structure includes a substrate; a die over and flip bonded on the substrate; a heat sink over the die; and one or more spacer separating the heat sink from the substrate.

15 Claims, 6 Drawing Sheets

FLIP CHIP PACKAGES WITH SPACERS SEPARATING HEAT SINKS AND SUBSTRATES

TECHNICAL FIELD

This invention relates to the packaging of semiconductor chips, and more particularly to flip-chip packaging structures.

BACKGROUND

A flip chip package includes a direct electrical connection of a down-facing (that is, "flipped") semiconductor chip onto a substrate, such as a ceramic substrate or a circuit board, using conductive bumps. Flip chip technology is quickly replacing older wire bonding technology that uses up-facing chips with conductive wires to connect bond pads on chips to substrates.

FIG. 1 illustrates a cross-sectional view of a conventional flip-chip package, which includes semiconductor chip (also referred to as a die in the packaging art) 10 bonded onto package substrate 12 through solder bumps 14. Underfill 15 is filled between solder bumps 14 to protect solder bumps 14 from cracking. The backside of die 10 is thermally coupled to heat sink 18. Heat sink 18 may be secured onto printed circuit board (PCB) 20 through screws or spring clamps (not shown).

After the package as shown in FIG. 1 is formed, but before it is used, the force applied on die 10 only includes the weight of heat sink 18, and the force applied by the screws or spring clamps. During the usage of the package, however, the temperature of die 10 rises, which may reach as high as about 125° C. The stress applied on die 10 thus rises due to the mismatch between coefficients of thermal expansion (CTE) of die 10 and package substrate 12. Typically, the CTE of die 10 is about 3, while the CTE of package substrate 12 is about 15 to about 17. The significant CTE mismatch results in the increase of the stress applied on die 10, and will cause solder bumps 14 to crack.

Conventionally, the problem of the increased stress may be solved by applying stronger underfill 15. However, in recent generations of integrated formation technologies, low-k dielectric materials are increasingly used, and the k values of the low-k dielectric materials become increasingly lower. The strengths of the low-k dielectric materials are thus increasingly weaker. Unfortunately, stronger underfill 15 causes a greater stress to be applied on the low-k dielectric layers in die 10, resulting in the delamination of the low-k dielectric layers.

To protect the low-k dielectric layers, underfill 15 preferably has a low glass transition temperature (Tg). Low-Tg underfills become soft at relatively low temperatures. When the temperature of die 10 rises, the modulus of underfill 15 decreases, so that the stress applied on the low-k dielectric materials is released. However, with lower modulus, the protection provided by low-Tg underfill 15 to solder bumps 14 is reduced, subject solder bumps 14 to cracking, which may result in an open circuit. The conflicting requirements of solder bumps 14 and low-k dielectric materials hence require a new package structure, and methods for forming the same.

SUMMARY OF THE INVENTION

In accordance with one aspect of the present invention, a package structure includes a substrate; a die over and flip bonded on the substrate; a heat sink over the die; and one or more spacer separating the heat sink from the substrate.

In accordance with another aspect of the present invention, a package structure includes a package substrate having a first side and a second side; a die having a front side and a back side, wherein the front side of the die is flip bonded onto the first side of the package substrate; a heat sink mounted on the backside the die; and a plurality of spacers spaced apart from each other, each having a first end contacting the heat sink, and a second end contacting the first side of the package substrate.

In accordance with yet another aspect of the present invention, a package structure includes a package substrate having a first side and a second side; a die having a front side and a back side, wherein the front side of the die is flip bonded onto the first side of the package substrate; a heat sink mounted on the backside the die; a thermal interface material (TIM) between and adjoining the die and the heat sink; and a plurality of spacers around the die and spaced apart from each other, each having a first end contacting the first side of the package substrate, and a second end contacting the heat sink. Each edge of the die is adjacent to at least one of the plurality of spacers.

By using spacers to separate dies and heat sinks, the stresses generated due to the heat generated in dies are absorbed by the spacers, and hence both low-k dielectric materials in the dies and the solder bumps may be protected at the same time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel package structure and the method of forming the same are provided. The variations of the preferred embodiments are discussed. Throughout the various views and illustrative embodiments of the present invention, like reference numbers are used to designate like elements.

Figure 1:
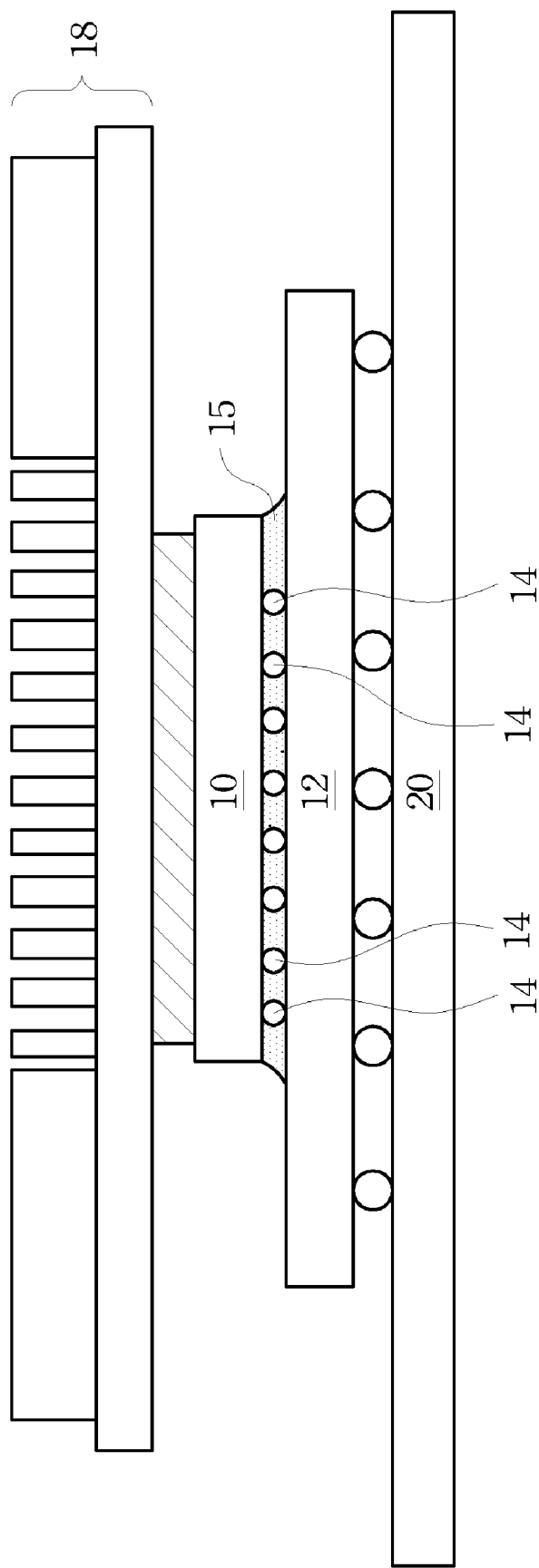
FIG. 1 illustrates a cross-sectional view of a conventional flip-chip package structure including a package substrate, a die, and a heat sink.
Figure 2:
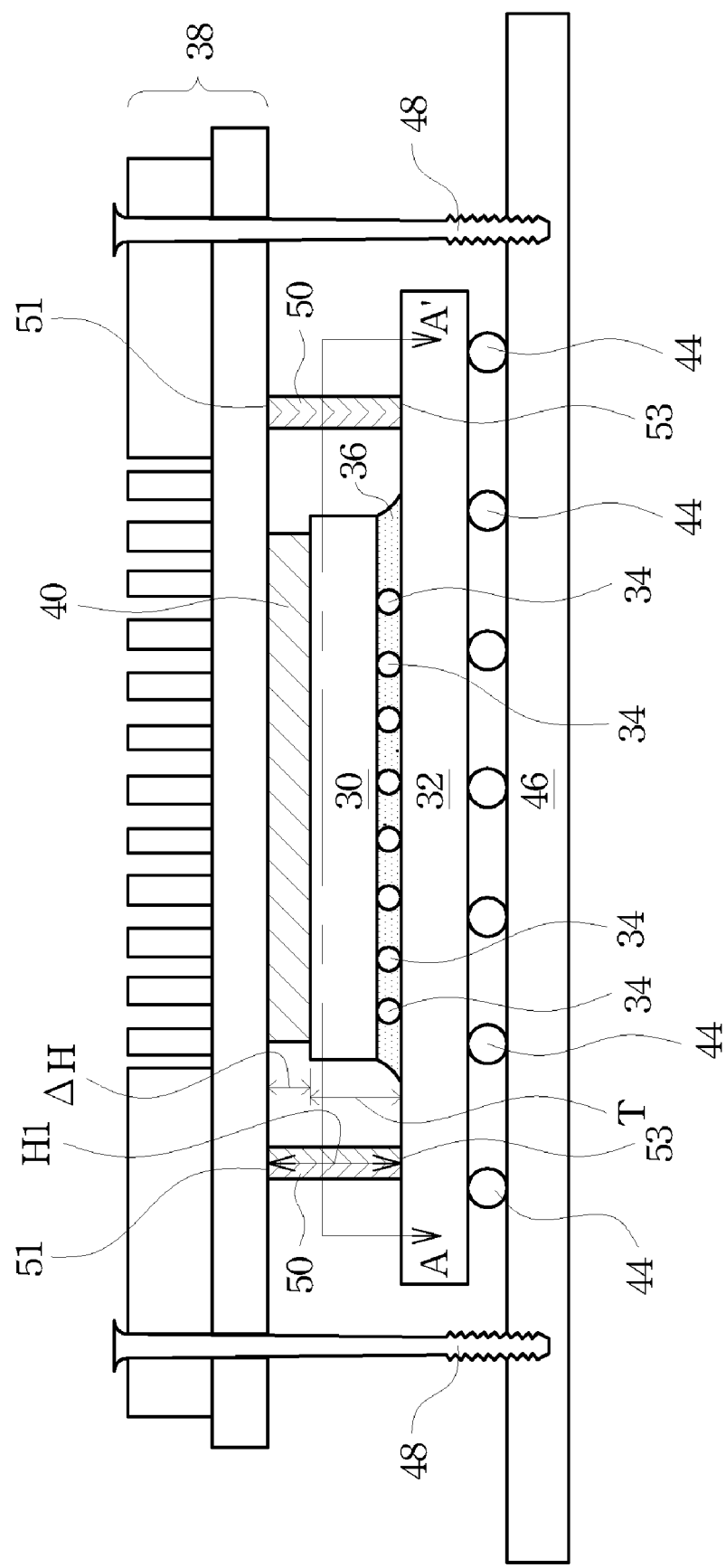
FIG. 2 illustrates a cross-sectional view of an embodiment of the present invention, wherein spacers are placed between a heat sink and a package substrate.

FIG. 2 illustrates an embodiment of the present invention. Die 30 is flip bonded onto package substrate 32 through solder bumps 34. Die 30 has integrated circuits (not shown)

formed therein. The interconnect structure (not shown) of die 30 preferably includes low-k dielectric materials (not shown) with k values lower than about 3.0, and more preferably between about 2.0 and 3.0. Underfill 36 is filled into the space between die 30 and package substrate 32. Preferably, underfill 36 has a glass transition temperature (Tg) of lower than about 120° C., and more preferably lower than about 80° C.

Heat sink 38 is mounted over, and thermally coupled to die 30. Heat sink 38 is preferably formed of metal, and thus has a high thermal conductivity. In an embodiment, heat sink 38 and die 30 are joined by a thermal interface material (TIM) layer 40. TIM layer 40 preferably has a high thermal conductivity for effectively dissipating the heat generated by die 30 into heat sink 38. The exemplary materials of TIM layer 40 include silicone rubber with a thermally-conductive filler such as aluminum oxide and/or boron nitride, or silicone resin filled with a thermally-conductive material such as aluminum powder, nickel, aluminum oxide, iron oxide, beryllium oxide, and/or silver. In an exemplary embodiment, TIM layer 40 has a thickness of between about 20 μm and about 200 μm.

In alternative embodiments, no TIM is applied, and heat sink 38 is in direct contact with the backside of die 30.

Package substrate 32 includes metal traces (not shown) formed therein, which route the electrical connection from one side of package substrate 32 to the other. Solder bumps 34 are electrically connected to ball grid array (BGA) balls 44, which further bond package substrate 32 and printed circuit board (PCB) 46 together. In an embodiment, heat sink 38 is secured onto PCB 46 through screws 48. In other embodiments, heat sink 38 is secured onto PCB 46 using other fixtures, such as spring clamps (not shown).

Spacers 50, which are preferably non-elastic, are placed between package substrate 32 and heat sink 38. In an embodiment, spacers 50 are formed of metals. In other embodiments, spacers 50 are formed of ceramics. In yet other embodiments, spacers 50 are formed of plastics, which preferably have glass transition temperatures of greater than the working temperature range of die 30, for example, greater than about 125° C. Accordingly, spacers 50 remain hard even if the temperature of die 30 rises when it is powered on. Spacers 50 may be fixed on package substrate 32 using solders, adhesive epoxy, adhesive pastes, and the like. Alternatively, spacers 50 are fixed on heat sink 38. Spacers 50 have first end(s) 51 and second end(s) 53. Preferably, only one of the end(s) 51 and 53 is fixed on the corresponding one of the package substrate 32 and heat sink 38, while the other ends are in contact, but not fixed, on the other one of the package substrate 32 and heat sink 38.

The height H1 of spacers 50 is preferably greater than the combined thickness T of die 30 and solder bumps 34, for example, by a different ΔH of between about 25 μm and about 125 μm. In the case no TIM layer is deployed, the height H1 is preferably substantially equal to the combined thickness T. Accordingly, the top ends of spacers 50 are preferably in contact with heat sink 38, while the bottom ends of spacers 50 are in contact with package substrate 32.

Figure 3A:
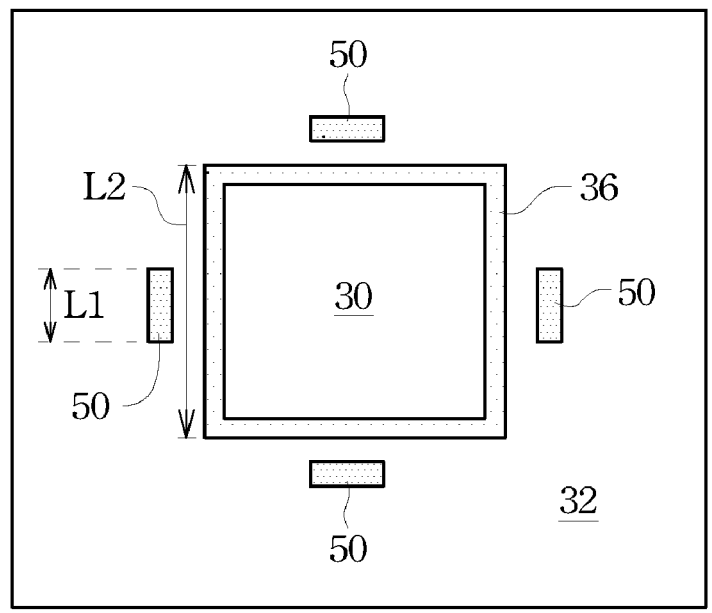
FIG. 3A illustrates a top view of the structure shown in FIG. 2, wherein spacers are dispatched between a heat sink and a package substrate.
Figure 3B:
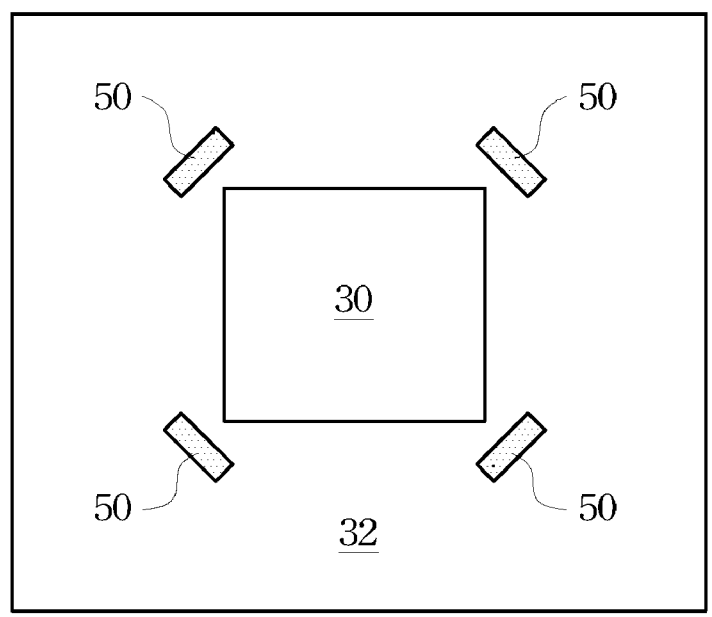
FIGS. 3B and 4 are top views of alternative embodiments of the present invention.

FIG. 3A illustrates a top view of the structure shown in FIG. 2, wherein the top view is taken along a plane crossing line A-A'. Spacers 50 are preferably spaced apart from die 30 and underfill 36. In an embodiment, as shown in FIG. 3A, spacers 50 includes a plurality of individual spacers, which are spaced apart from each other. Preferably, spacers 50 are substantially evenly distributed around die 30. In FIG. 3A, spacers 50 are allocated close to the center of the edges of die 30. FIG. 3B illustrates a top view of an alternative embodiment, in which spacers 50 are allocated close to the corners of die 30. In alternative embodiments, spacers 50 may have a different number, for example, three, six, eight, etc.

The length L1 of spacers 50 is preferably less than about 50% percent of the length L2 of die 30, so that spacers 50 do not significantly affect the ventilation of die 30. Accordingly, heat may be dissipated not only through the top surface of heat sink 38, but also through the edges of die 30 and the bottom surface of heat sink 38.

Figure 4:
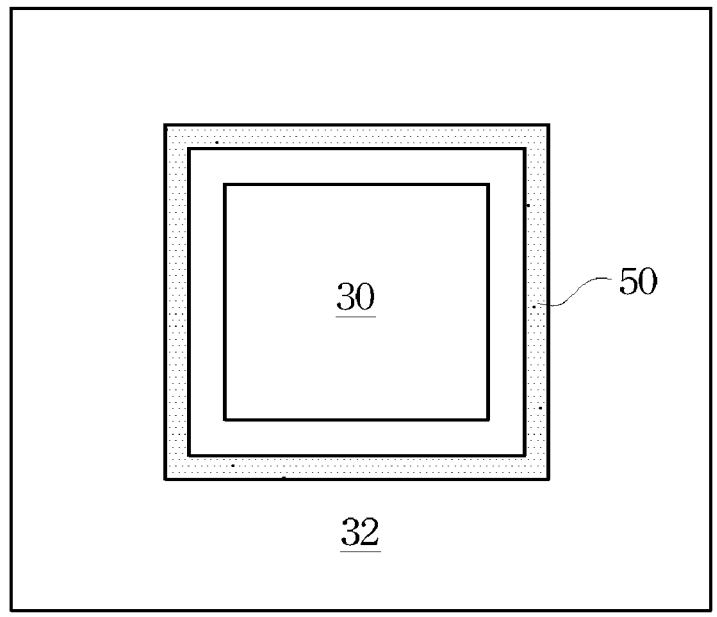
Figure 5A:
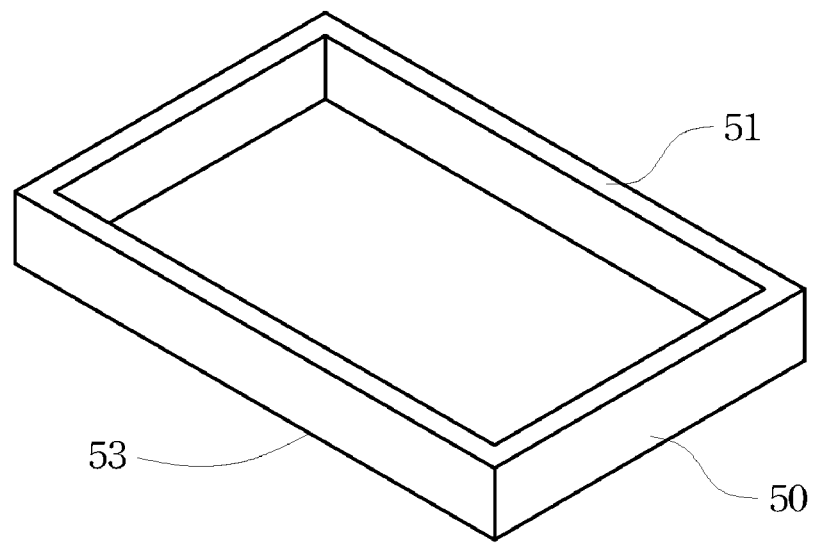
FIGS. 5A and 5B illustrate package structures including spacer rings.
Figure 5B:
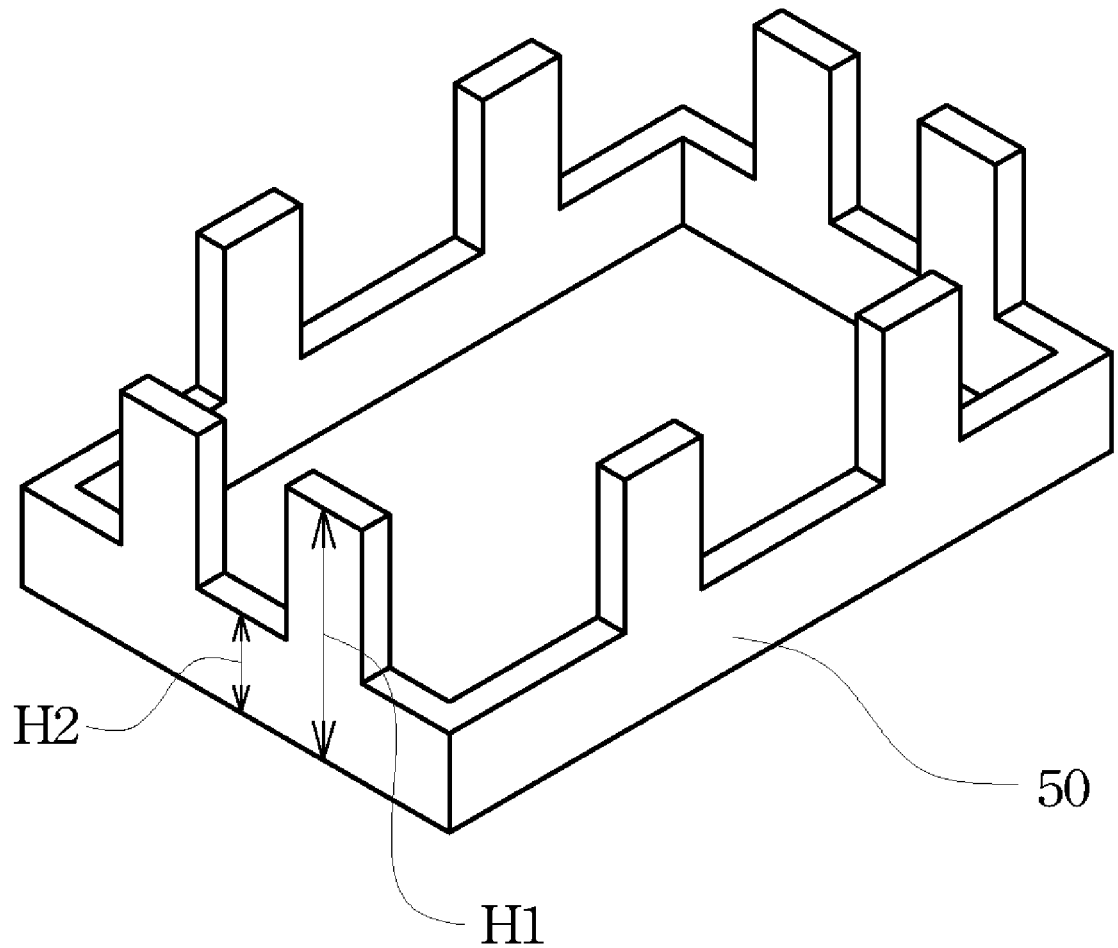

FIG. 4 illustrates a top view of an alternative embodiment, wherein spacers 50 form a ring around die 30. In this embodiment, each side of the spacer ring 50 may form a block wall, as is shown in FIG. 5A. In this case, spacer ring 50 is not only a spacer ring, but also acts as a stiffener ring. Alternatively, spacer ring 50 is patterned, as shown in FIG. 5B. In this case, first portions of spacer ring 50 have a height H1, which is substantially equal to the distance between package substrate 32 and heat sink 38 (refer to FIG. 3A). Second portions of spacer ring 50 have height H2 smaller than height H1. Advantageously, the lower portion of spacer ring 50, which is itself a ring with height H2, has the function for preventing the warpage of package substrate 32. The first portions of spacer ring 50 with the height H1 may act as spacers to prevent excess force applied on die 30 and solder bumps 34. Furthermore, in the embodiments wherein spacer ring 50 is formed of a material with a low thermal conductivity, heat may still be dissipated through the spaces between the first portions of spacer ring 50.

Figure 6:
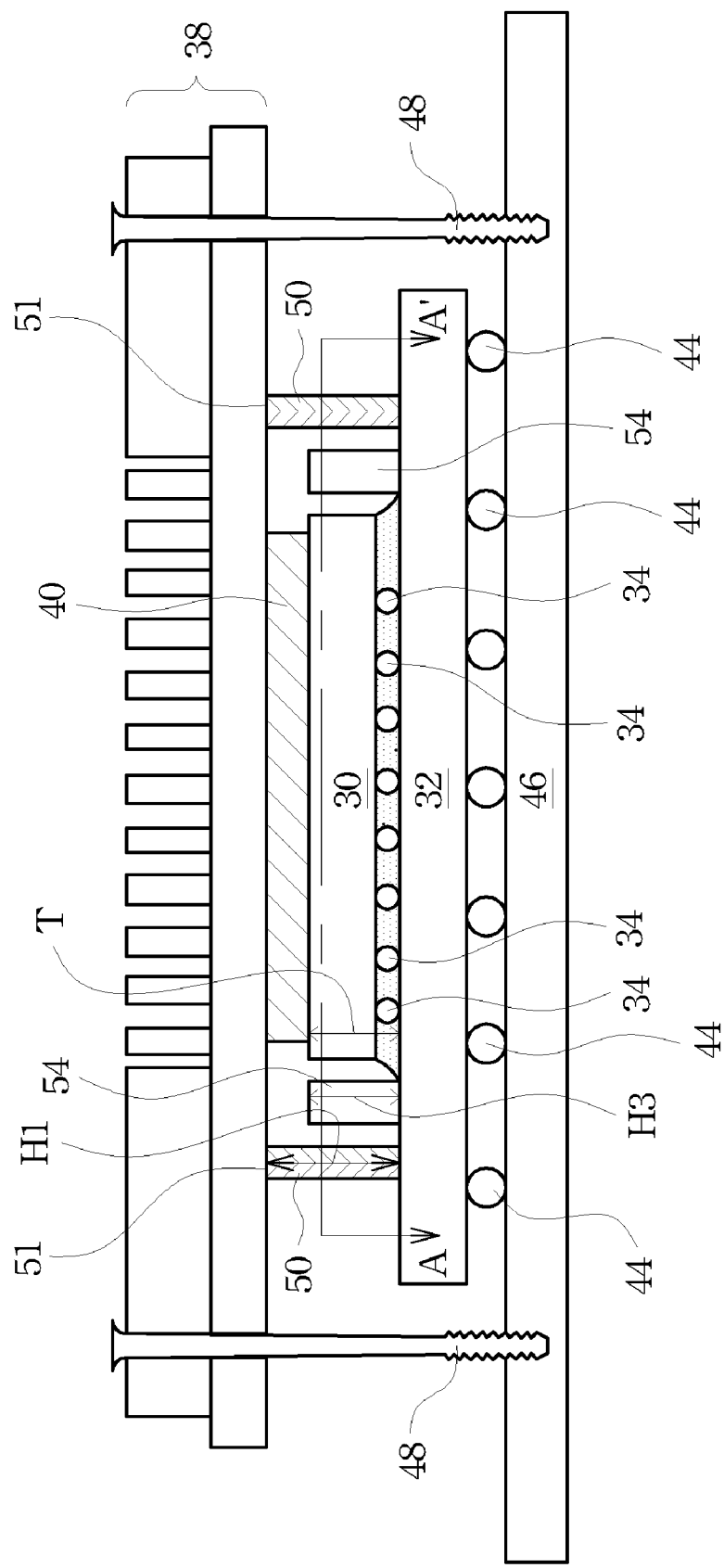
FIG. 6 illustrates a package structure including a stiffener ring and spacers.

In FIG. 6, spacers 50 are combined with stiffener ring 54, which is preferably mounted between spacers 50 and die 30. In order to provide a better heat-dissipating ability, stiffener ring 54 may have a height H3 lower than the combined thickness T of die 30 and solder bumps 34. Accordingly, the height H1 of spacers 50 is greater than height H3.

In following paragraphs, the process steps for forming the package embodiments of the present invention are briefly discussed. It is noted that these process steps are only examples, and the embodiments of the present invention may be formed using process steps with different orders.

Referring back to FIG. 2, in the beginning of the packaging process, spacers 50 are assembled on package substrate 32 first. If spacers 50 are formed of wettable materials such as some metals, spacers 50 may be soldered, or adhered using an adhesive, on package substrate 32. If spacers 50 are formed of non-wettable materials such as ceramic or plastic, adhesive epoxies or pastes may be used for adhering spacers 50. Alternatively, spacers 50 are pre-assembled on heat sink 38.

Next, solder bumps 34 are mounted on bond pads (not shown) of die 30. A reflow is then performed to bond die 30 onto package substrate 32. Underfill 36 is then filled into the space between die 30 and package substrate 32. A curing is then performed to solidify underfill 36.

BGA balls 44 are then mounted on package substrate 32, and then package substrate 32 is bonded onto PCB board 46 through a reflow step. TIM layer 40 is then applied on the backside of die 30. Preferably, the applied TIM layer 40 has a top surface higher than the top edges of spacers 50.

Heat sink 38 is then mounted on TIM layer 40. With a small force applied, the top surface of TIM layer 40 becomes leveled with the top edges of spacers 50. TIM is cured if thermalset materials are used. Heat sink 38 thus has a good thermal contact with die 30 through TIM layer 40. Screws 48 are then placed to secure heat sink 38. Alternatively, spring clamps (not shown) are used.

With spacers 50 placed between package substrate 32 and heat sink 38, in the thermal cycles of die 30 due to its usage, when excess stresses are generated, the excess stresses are absorbed by spacers 50, and will not be applied on die 30 and solder bumps 34. Solder bumps 34 are hence protected. Accordingly, underfill 36 may have a low glass transition temperature Tg, so that underfill 36 may be softened with the increase in temperatures to absorb stresses that may otherwise be applied on the low-k dielectric layers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A package structure comprising:
    a substrate;
    a die over and flip bonded on the substrate;
    a stiffener ring encircling the die;
    a heat sink over the die;
    a spacer separating the heat sink from the substrate; and
    a plurality of additional spacers, wherein the spacer and the plurality of additional spacers are substantially evenly distributed around the die.

2. The package structure of claim 1, wherein the spacer comprises a first end contacting the substrate, and a second end contacting the heat sink.

3. The package structure of claim 1, wherein the spacer is formed of a non-elastic material.

4. The package structure of claim 1, wherein the spacer is spaced apart from the die.

5. The package structure of claim 1 further comprising:
    a printed circuit board (PCB), wherein the substrate is mounted on the PCB; and
    a fixture securing the heat sink on the PCB.

6. A package structure comprising:
    a package substrate having a first side and a second side;
    a die having a front side and a back side, wherein the front side of the die is flip bonded onto the first side of the package substrate;
    a heat sink mounted on the back side of the die;
    a plurality of spacers spaced apart from each other, each having a first end contacting the heat sink, and a second end contacting the first side of the package substrate;
    a stiffener ring around the die, wherein the stiffener ring is between the die and the plurality of spacers;
    a printed circuit board (PCB), wherein the second side of the package substrate is mounted on the PCB; and
    a fixture securing the heat sink on the PCB.

7. The package structure of claim 6, wherein the plurality of spacers are distributed substantially evenly around the die.

8. The package structure of claim 6 further comprising a thermal interface material (TIM) between and adjoining the die and the heat sink.

9. The package structure of claim 6, wherein the plurality of spacers is formed of non-elastic plastics.

10. The package structure of claim 6, wherein the plurality of spacers comprises metals.

11. The package structure of claim 6, wherein the plurality of spacers comprises ceramics.

12. A package structure comprising:
    a package substrate having a first side and a second side;
    a die having a front side and a back side, wherein the front side of the die is flip bonded onto the first side of the package substrate;
    a heat sink mounted on the back side of the die;
    a thermal interface material (TIM) between and adjoining the die and the heat sink; and
    a plurality of spacers around the die and spaced apart from each other, each having a first end contacting the first side of the package substrate, and a second end contacting the heat sink, wherein each edge of the die is adjacent to at least one of the plurality of spacers, and wherein one of the first end and the second end of each of the plurality of spacers is fixed onto a respective one of the package substrate and the heat sink, and a remaining one of the first end and the second end of each of the plurality of spacers is in physical contact and not fixed onto a respective one of the package substrate and the heat sink.

13. The package structure of claim 12, wherein the first end of each of the plurality of spacers is fixed onto the package substrate, and wherein the second end of each of the plurality of spacers is in physical contact and not fixed onto the heat sink.

14. The package structure of claim 12, wherein the first end of each of the plurality of spacers is in physical contact and not fixed onto the package substrate, and wherein the second end of each of the plurality of spacers is fixed onto the heat sink.

15. A package structure comprising:
    a substrate;
    a die over and flip bonded on the substrate;
    a heat sink over the die; and
    a spacer separating the heat sink from the substrate, wherein the spacer forms a ring around the die, wherein the spacer comprises a first end and a second end, each in physical contact with one of the heat sink and the substrate, and wherein the ring comprises a first plurality of horizontal portions and a second plurality of horizontal portions allocated in an alternating pattern, with the first and the second plurality of horizontal portions having different heights.

* * * * *